United States Patent [19]
Egusa

[11] Patent Number: 5,105,233
[45] Date of Patent: Apr. 14, 1992

[54] SEMICONDUCTOR LUMINESCENT DEVICE HAVING ORGANIC/INORGANIC JUNCTION

[75] Inventor: Syun Egusa, Yokohama, Japan

[73] Assignee: Kabushiki Kaisha Toshiba, Kawasaki, Japan

[21] Appl. No.: 669,020

[22] Filed: Mar. 13, 1991

[30] Foreign Application Priority Data

Mar. 13, 1990 [JP] Japan .................. 2-61526

[51] Int. Cl.$^5$ .............................. H01L 33/00
[52] U.S. Cl. .......................... 357/17; 357/8; 357/16; 357/12
[58] Field of Search ............ 357/17, 8, 16, 12

[56] References Cited

U.S. PATENT DOCUMENTS

| | | | |
|---|---|---|---|
| 4,819,057 | 4/1989 | Naito et al. | 357/17 |
| 4,907,043 | 3/1990 | Uekita et al. | 357/17 |
| 5,006,915 | 4/1991 | Yoshikawa et al. | 357/8 X |

FOREIGN PATENT DOCUMENTS

| | | | |
|---|---|---|---|
| 1312873 | 12/1989 | Japan | 357/8 X |
| 1312874 | 12/1989 | Japan | 357/8 X |

OTHER PUBLICATIONS

Hayashi et al., "Electroluminescence of Perylene Films with a Conducting Polymer as an Anode", Japanese Journal of Applied Physics, vol. 25, No. 9, Sep. 1986, pp. L773–L775.

"Electroluminescence in Organic Films with Three-Layer Structure", Japanese Journal of Applied Physics, vol. 27, No. 2, Feb. 1988, pp. L269–L271, Adachi et al.

Tang et al., "Organic Electroluminescent Diodes," Appl. Phys. Lett. 51 (12), Sep. 21, 1987, pp. 913–915.

Forrest et al., "Organic-on-Inorganic Semiconductor Contact Barrier Diodes, I, Theory with Applications to Organic Thin Films and Prototype Devices," J. Appl. Physics 55 (6), 15 Mar. 1984, pp. 1492–1507.

Primary Examiner—William Mintel
Attorney, Agent, or Firm—Oblon, Spivak, McClelland, Maier, & Neustadt

[57] ABSTRACT

A semiconductor luminescent device having a structure in which an organic layer is sandwiched between first and second electrodes and having an organic/inorganic junction in which at least the first electrode of the first and second electrodes consists of an n-type inorganic semiconductor. A junction between the first electrode and the organic layer forms a blocking contact against electron injection from the first electrode into the organic layer and hole injection from the organic layer into the first electrode. A junction between the second electrode and the organic layer facilitates injection of holes from the second electrode into the organic layer. An electric double layer is formed in the junction portion between the organic layer and the first electrode when a voltage positive with respect to the first electrode is applied to the second electrode, thereby causing tunnel injection of carriers between the first electrode and the organic layer to obtain recombination luminescence in at least one of the first electrode and the organic layer.

14 Claims, 11 Drawing Sheets

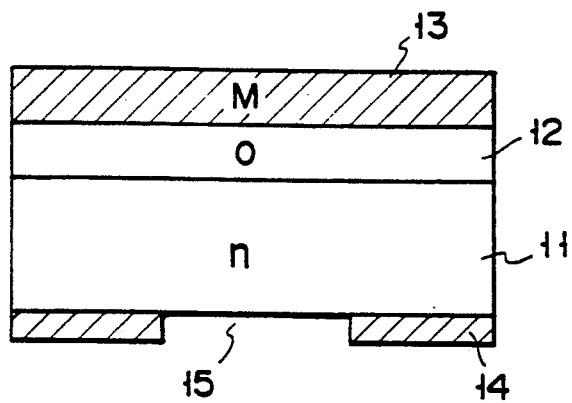
F I G. 1
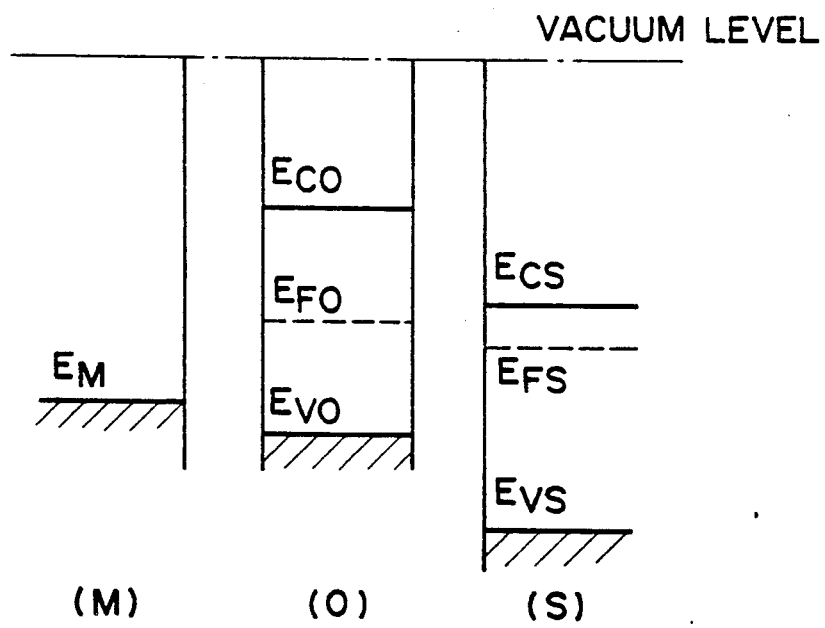
F I G. 2

(M) (O) (S)

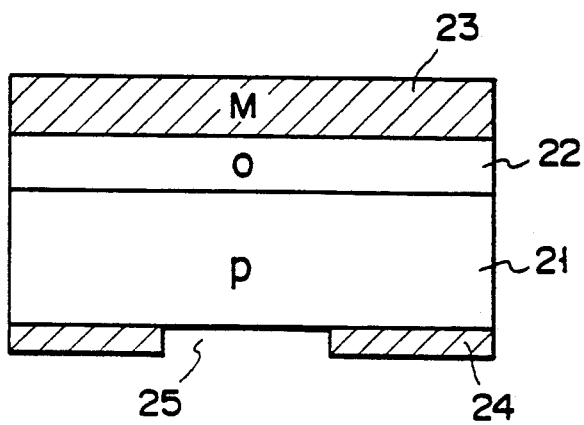
F I G. 5
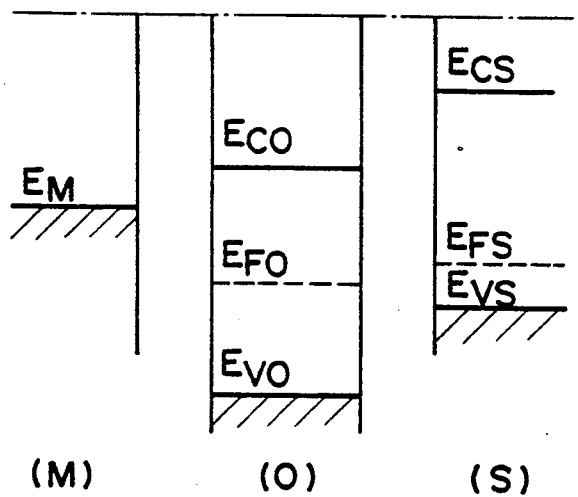
F I G. 6

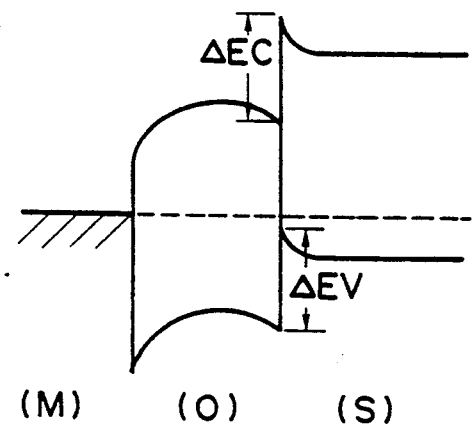
F I G. 7
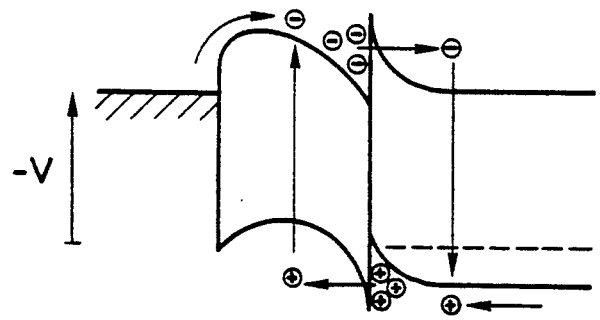
F I G. 8

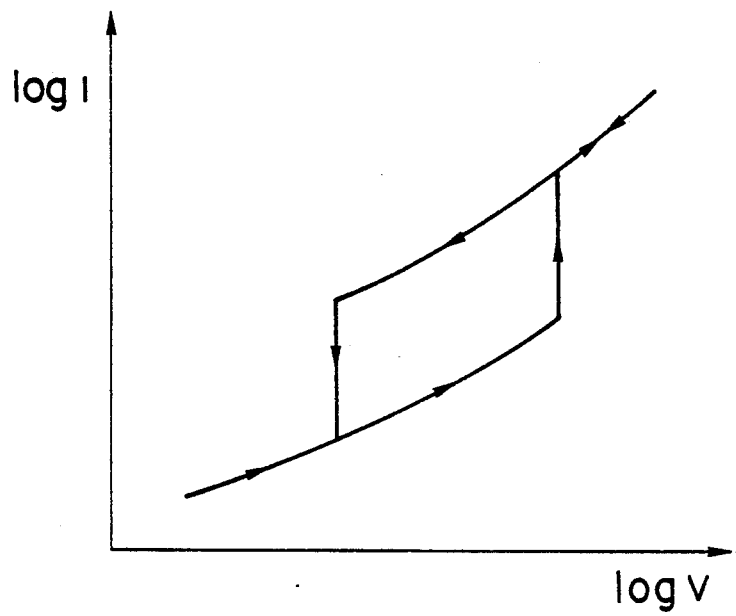
F I G. 9
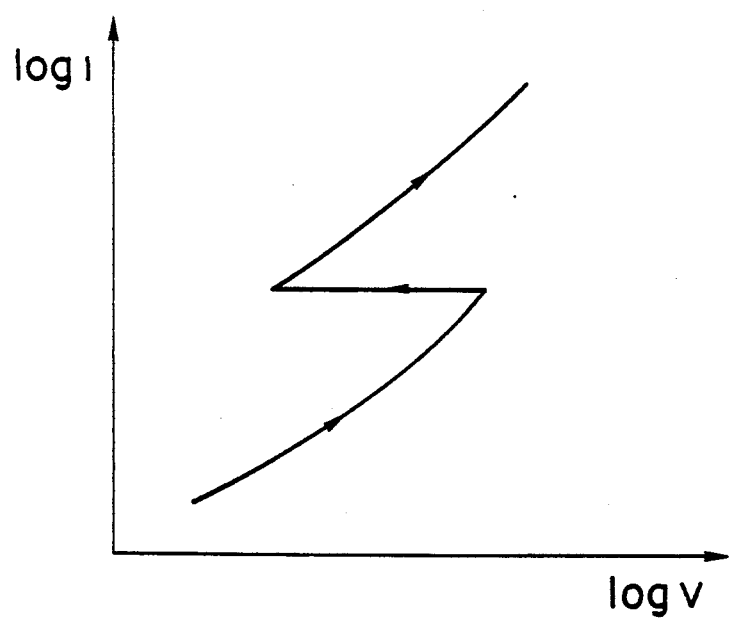
F I G. 10

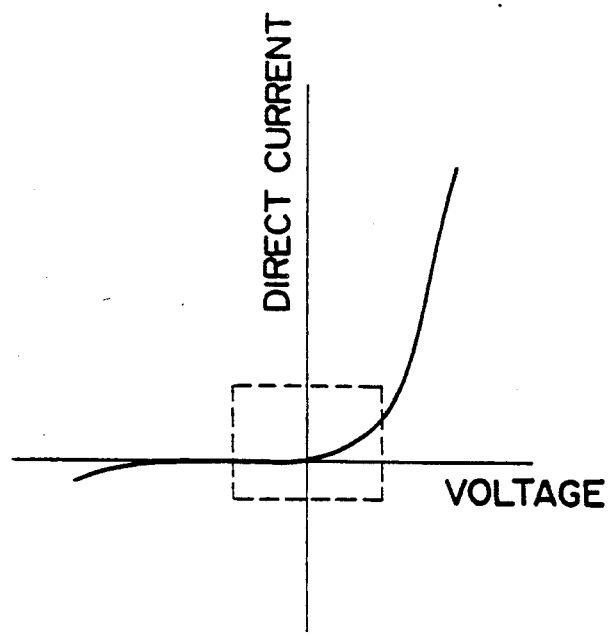
F I G. 11
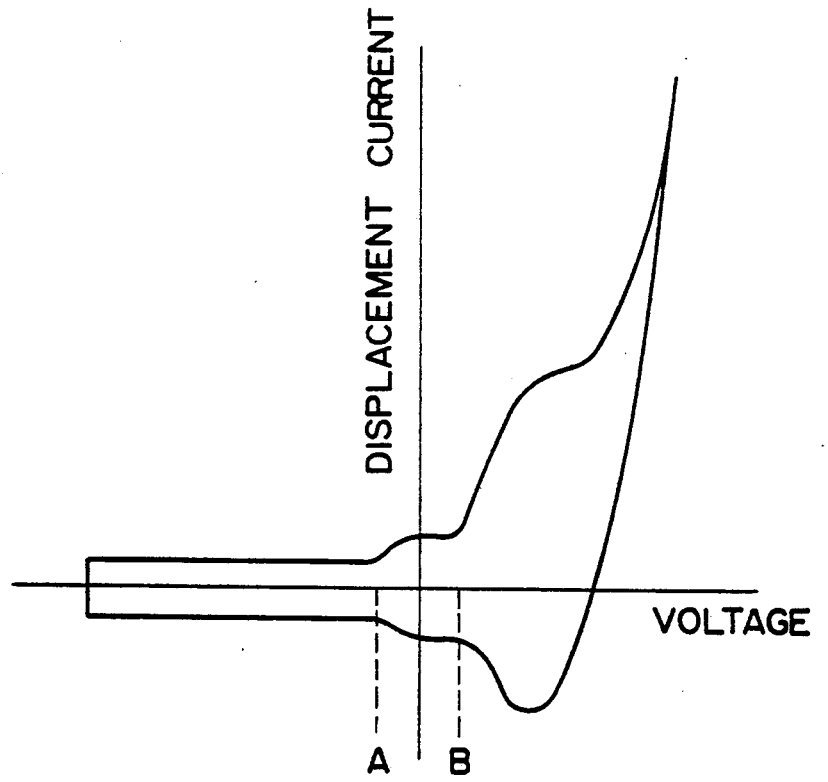
F I G. 12

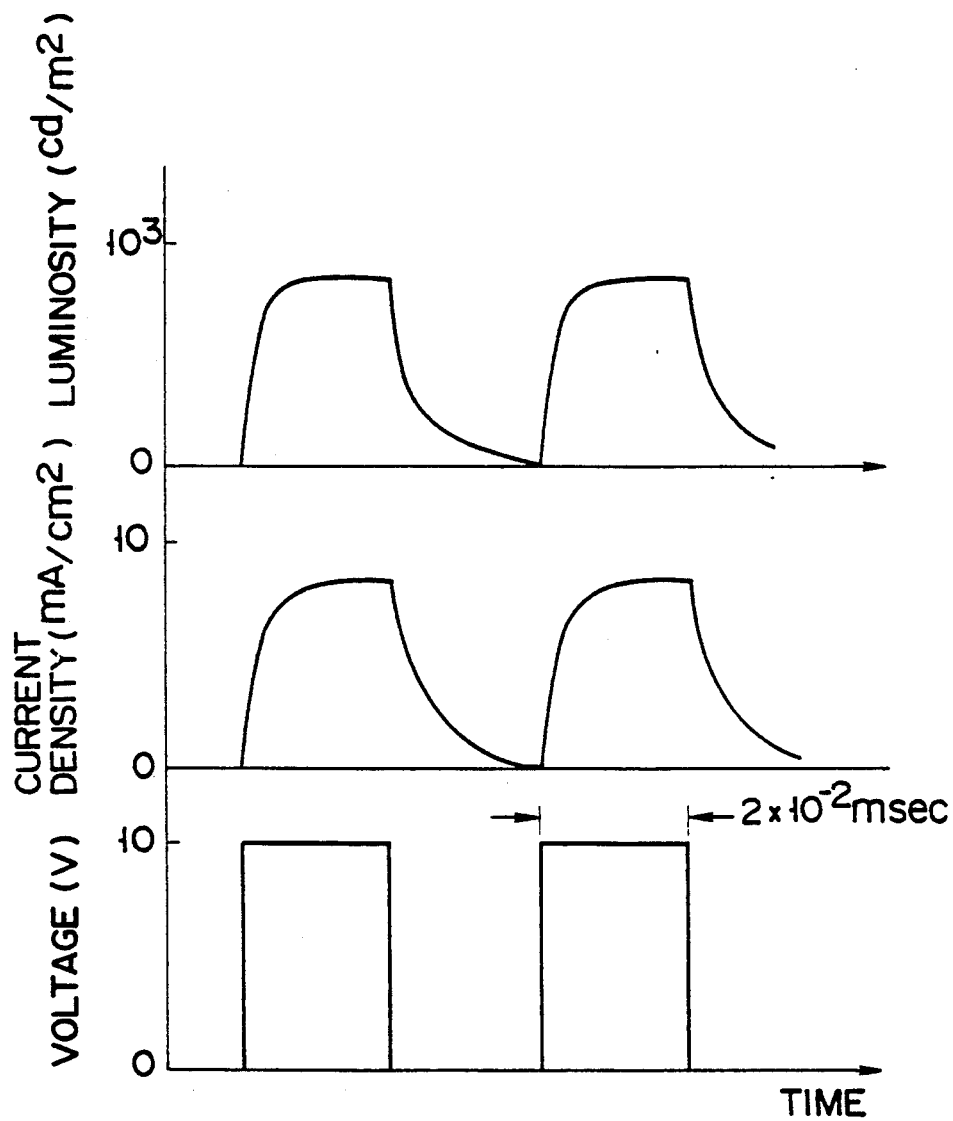
F I G. 15

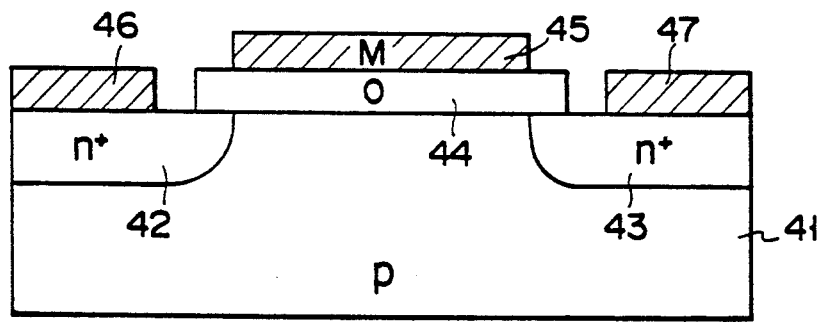
F I G. 19
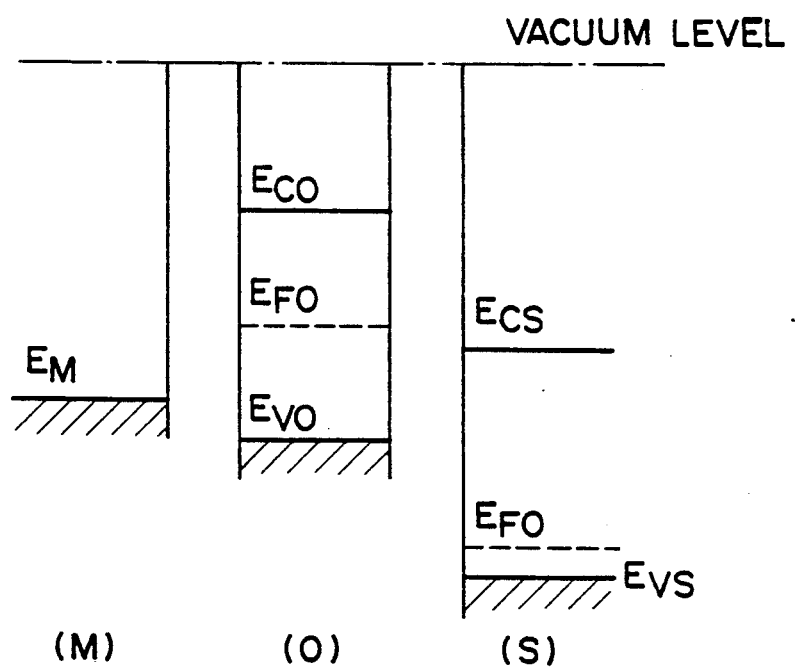
F I G. 20
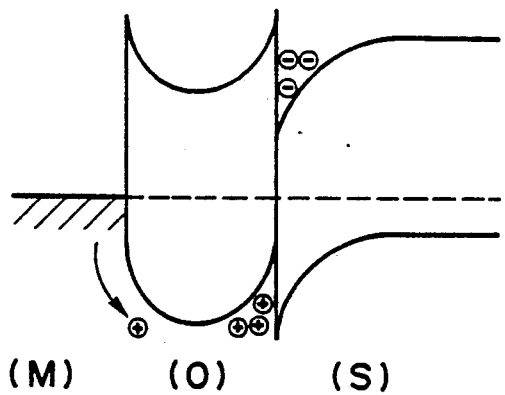
F I G. 21

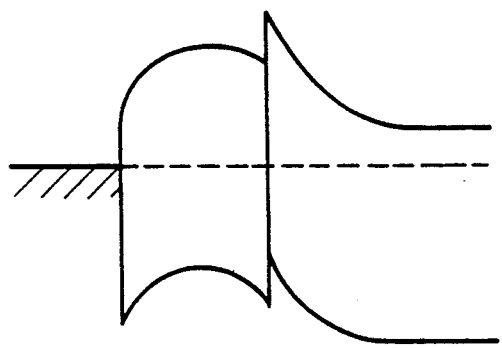
$V_G = 0$
F I G. 22A
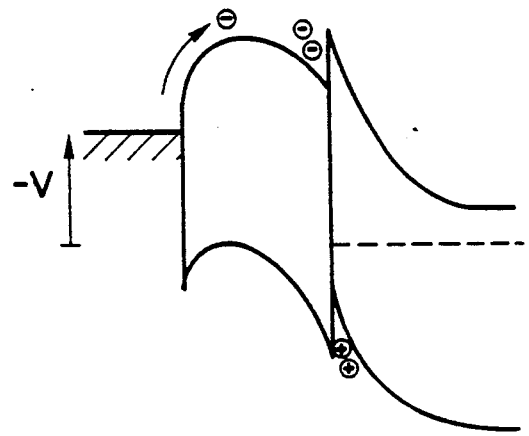
$V_G = -V$
F I G. 22B
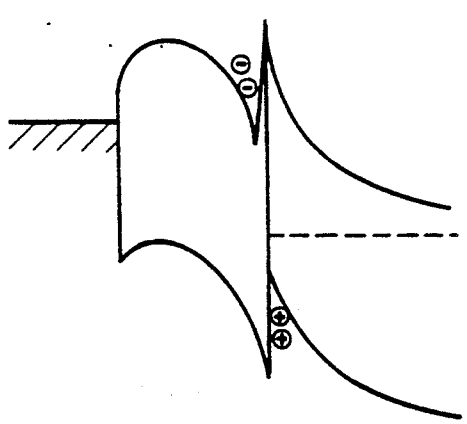
$V_G = -V$
F I G. 22C
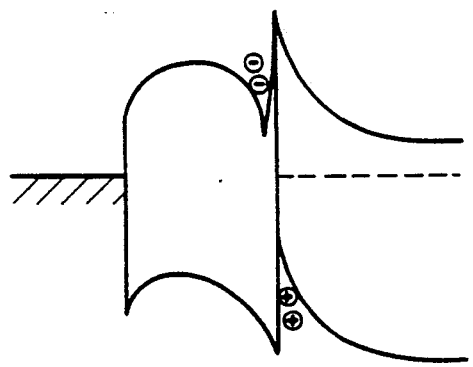
$V_G = 0$
F I G. 22D

SEMICONDUCTOR LUMINESCENT DEVICE HAVING ORGANIC/INORGANIC JUNCTION

BACKGROUND OF THE INVENTION

1. Field of the Invention

The present invention relates to a semiconductor luminescent device having an organic/inorganic junction structure.

2. Description of the Related Art

In recent years, research and development of an organic electro luminescent device to be used as, e.g., a display device or an illumination device have become a big concern. For example, Shogo Saito at Kyushu University has reported a organic two-layered structure device using metal electrode/aromatic dye/polythiophene/transparent electrode in 1986 (J.J. Appl. Phys. 25, L773, 1986). In this device, the thickness of an organic film is 1 $\mu$m or more, and an application voltage is as high as 100 V. C. W. Tang et al. of Eastman Kodak Co. have reported that when the thickness of an organic film is decreased to be 1,000 Å or less in an organic two-layered structure of Mg·Ag/Alq3/diamine/ITO, a device using this structure can provide a practically satisfactory luminosity when it is driven at an application voltage of 10 V or less (Appl. Phys. Lett., 51 (12), 21 Sept. 1987, pp. 913–915). These luminescent devices are based on an organic two-layered structure obtained by combining a dye having an electron injecting property and a dye having a hole injecting property and have characteristic features in that the thickness of an organic film is minimized, a material having a small work function is selected as a metal electrode on an electron injection side, and a material is selected so as not to produce an electrical defect when an organic film is formed by a vacuum deposition method or a sublimation method. Shogo Saito at Kyushu University has further proposed an organic three-layered structure device of electron-injecting layer/luminescent layer/hole-injecting layer and reported that high-luminosity luminescence can be obtained by selecting a dye having high photoluminescence as a luminescent layer (J.J. Appl. Phys., 27, L269, 1988).

In addition, many researches efforts such as research into luminescent device structure obtained by combining various types of organic films, research indicating that a certain degree of luminescence can be obtained even in a single-layered organic film by mixing a luminescent agent and a hole injecting agent, and research concerning characteristic degradation in Alq3 as a luminophor have been reported, and a large number of associated patent applications have been filed.

In a flat display panel which has been used in various types of electronic equipment in recent years, a large number of display pixels are arranged in a matrix manner and time-divisionally driven. The flat panel display system is classified into a simple matrix system and an active matrix system. In each system, however, a drive voltage to be applied on one pixel is pulsated, and a voltage application time is very short. In order to obtain an image with high quality, therefore, each pixel must have a certain degree of memory function. In a liquid-crystal display, for example, this memory function is obtained by the capacitance of a liquid crystal itself or a capacitance connected in parallel with the liquid crystal.

Similarly, an organic film luminescent device must have the memory function when it is applied to the matrix-driven flat panel display as described above. No organic film luminescent device having such a memory function, however, has been reported yet.

In addition, the life of a luminescent device using an organic film is very short, i.e., about 1,000 hours. This is mainly because the luminous efficacy of the device is as low as at most about 1% and Joule heat is generated by current components not contributing to luminescence and destroys an organic film structure which is weak against heat.

As described above, an organic film luminescent device is still far from the stage of practical applications in terms of characteristics and lifetime.

SUMMARY OF THE INVENTION

It is an object of the present invention to provide a luminescent device which can largely improve characteristics and lifetime by using an organic/inorganic junction structure.

It is another object of the present invention to provide a field-effect device which realizes good characteristics by using a similar organic/inorganic semiconductor junction structure in a gate portion.

A semiconductor device according to the present invention has an organic/inorganic junction structure and is characterized by using a material combination which forms an electric double layer in the junction portion by storage of carriers upon application of a predetermined voltage.

That is, a luminescent device according to the present invention has a structure in which an organic layer is sandwiched between first and second electrodes. At least the first electrode of the first and second electrodes consists of an inorganic semiconductor, and a junction between the first electrode and the organic layer forms a blocking contact against injection of electrons from one to the other and injection of holes in the opposite direction. In this luminescent device, when a voltage having a predetermined polarity with respect to the first electrode is applied to the second electrode, an electric double layer is formed in the junction portion between the organic layer and the first electrode. As a result, carriers are tunnel-injected between the first electrode and the organic film and recombined to emit light in at least on of the first electrode and the organic film.

Since the present invention adopts a junction structure of organic/inorganic semiconductors and utilizes a principle of electric double layer formation caused by injection of electrons and holes in the junction portion, luminescence with a high luminous efficacy can be obtained when it is applied to a luminescent device. In addition, since the luminous efficacy and radiation characteristics of an inorganic device are improved, a long-life device can be obtained. Furthermore, a memory function can be imparted to luminescent characteristics because carrier storage at a high density is used.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view showing a luminescent device according to an embodiment of the present invention;

FIG. 2 is a band diagram showing electrical characteristics of each portion of the luminescent device shown in FIG. 1 before bonding;

FIG. 5 is a sectional view showing a luminescent device according to another embodiment of the present invention;

FIG. 6 is a band diagram showing electrical characteristics of each portion of the luminescent device shown in FIG. 5 before bonding;

FIG. 7 is a band diagram showing a thermal equilibrium state thereof after bonding;

FIG. 8 is a band diagram for explaining a luminescent operation of the luminescent device shown in FIG. 5;

FIG. 9 is graph showing hysteresis characteristics of a luminescent device according to the present invention;

FIG. 10 is a graph showing negative resistance characteristics thereof;

FIG. 11 is a graph showing DC current-voltage characteristics thereof;

FIG. 12 is a graph showing transition current-voltage characteristics thereof;

FIG. 15 is a graph showing afterimage characteristics thereof;

FIG. 19 is a sectional view showing an embodiment in which the present invention is applied to an n-channel FET;

FIG. 20 is a graph showing electrical characteristics of each portion of the n-channel FET shown in FIG. 19 before bonding;

FIG. 21 is a band diagram showing a thermal equilibrium state thereof after bonding; and FIGS. 22A to 22D are band diagrams for explaining memory characteristics of an FET according to the present invention.

DETAILED DESCRIPTION OF THE PREFERRED EMBODIMENTS

Figure 3:
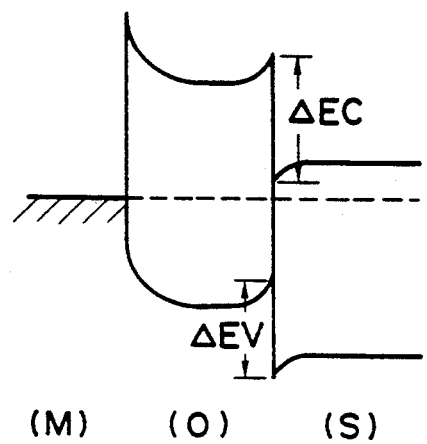
FIG. 3 is a band diagram showing a thermal equilibrium state thereof after bonding.

In the following embodiment, a luminescent device has a structure in which an organic layer including one or more organic films is sandwiched between first and second electrodes and a transparent inorganic semiconductor is used as the first electrode. The transparent inorganic semiconductor is selected from materials having wide band gaps, e.g., a Group III-V compound semiconductor such as GaP, AlGaAs, and GaAsP and a Group II-VI compound semiconductor such as ZnS, ZnSe, and CdS. The inorganic semiconductor is selected such that electrical characteristics of the organic layer and the material of the other electrode have a predetermined relationship in accordance with the conductivity type of the inorganic semiconductor.

FIG. 1 is a sectional view showing a luminescent device according to one embodiment of the present invention using an n-type semiconductor substrate. Referring to FIG. 1, an organic layer (O) 12 and a metal electrode (M) 13 as a second electrode are stacked on an n-type semiconductor substrate (S) 11 as a first electrode. An ohmic metal 14 having a light exit window 15 is formed on the lower surface of the substrate 11.

FIG. 2 shows electrical characteristics of each portion of the luminescent device of this embodiment obtained before bonding. Assuming that an energy difference (to be simply referred to as a conduction band level hereinafter) of the lower end of a conduction band of the substrate 11 from a vacuum level is $E_{CS}$, an energy difference (to be simply referred to as a Fermi level hereinafter) of the Fermi level of the substrate 11 from the vacuum level is $E_{FS}$, and an energy difference (to be simply referred to as a valence band level hereinafter) of the upper end of a valence band of the substrate 11 from the vacuum level is $E_{VS}$, the conduction band level, the Fermi level, and the valence band level of the organic layer 12 are $E_{CO}$, $E_{FO}$, and $E_{VO}$, respectively, and the work function of the metal electrode 13 is $E_M$, materials are so selected as to satisfy the following relations:

$$E_M > E_{FO} \quad (1)$$

$$E_{CO} < E_{CS} \quad (2)$$

$$E_{FO} < E_{FS} \quad (3)$$

$$E_{VO} < E_{VS} \quad (4)$$

More especially, it is preferable to satisfy the relation of $E_{VO} - E_M \leq 0.5$ eV.

FIG. 3 is a band diagram showing a thermal equilibrium state of the device of this embodiment. Referring to FIG. 3, in a junction portion between the organic layer (O) 1 and the n-type semiconductor substrate 11, a blocking barrier $\Delta E_C$ ($= E_{CS} - E_{CO}$) is formed in the conduction band against electrons injected from the substrate 11 into the layer 12, and a blocking barrier $\Delta E_V$ ($= E_{VS} - E_{VO}$) is formed in the valence band against holes injected from the layer 12 into the substrate 11. A junction which facilitates injection of holes from the metal electrode (M) 13 into the organic layer (O) 12 is formed between the electrode 13 and the layer 12.

Figure 4:
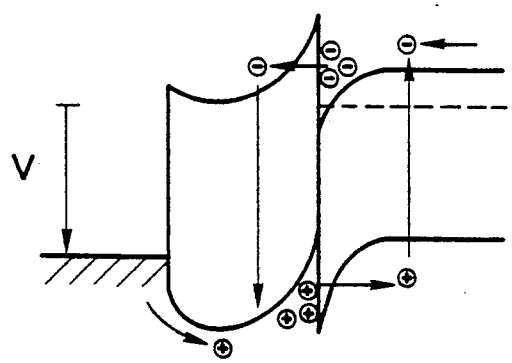
FIG. 4 is a band diagram for explaining a luminescent operation of the luminescent device shown in FIG. 1.

A luminescent operation of this luminescent device will be described below with reference to FIG. 4. FIG. 4 is a band diagram showing a state in which a positive voltage V is applied to the metal electrode 13 of this luminescent device. Holes injected from the metal electrode 13 into the organic layer 12 upon application of the voltage are stored in a junction interface between the layer 12 and the semiconductor substrate 11, and electrons in the substrate 11 are also stored in the junction interface between the layer 12 and the substrate 11, thereby forming an electric double layer in the junction interface. Since the thickness of this electric double layer is a molecular size (~1 nm) of a dye, an electric field generated in this portion is about $10^7$ V/cm accordingly. As a result, the stored carriers are easily tunnel-injected into an adjacent layer through the blocking contact.

The holes injected into the n-type semiconductor substrate 11 are recombined with the electrons as major carriers in the substrate 11 to emit light. If the organic layer 12 is a luminescent layer, the electrons injected into the layer 12 are recombined with the holes as major carriers in the layer 12 to emit light. The emitted light is extracted through the semiconductor substrate 11.

FIG. 5 is a sectional view showing a luminescent device according to another embodiment of the present invention using a p-type semiconductor substrate. Referring to FIG. 5, an organic layer (O) 22 and a metal electrode (M) 23 as a second electrode are stacked on a p-type semiconductor substrate (S) 21 as a first electrode. As in the first embodiment, an ohmic metal 24 having a light exit window 25 is formed on the lower surface of the substrate 21.

FIG. 6 shows electrical characteristics of each portion of the luminescent device of this embodiment obtained before bonding. Assuming that the conduction band level, the Fermi level, and the valence band level of the semiconductor substrate 21 are $E_{CS}$, $E_{FS}$, and $E_{VS}$, respectively, the conduction band level, the Fermi level, and the valence band level of the organic layer 22 are $E_{CO}$, $E_{FO}$, and $E_{VO}$, and the work function of the metal electrode 23 is $E_M$, materials are so selected as to satisfy the following relations:

$$E_M < E_{FO} \quad (5)$$

$$E_{CO} > E_{CS} \quad (6)$$

$$E_{FO} > E_{FS} \quad (7)$$

$$E_{VO} > E_{VS} \quad (8)$$

More especially, it is preferable to satisfy the relation of $E_M - E_{CO} \leq 0.5$ eV.

FIG. 7 is a band diagram showing a thermal equilibrium state of the device of this embodiment. Referring to FIG. 7, in a junction portion between the organic layer (O) 22 and the p-type semiconductor substrate (S) 21, a blocking barrier $\Delta E_C$ ($=E_{CO}-E_{CS}$) is formed in the conduction band against holes injected from the layer 22 into the substrate 21, and a blocking barrier $\Delta E_V$ ($=E_{VO}-E_{VS}$) is formed in the valence band against holes injected from the substrate 21 into the layer 22. A junction which facilitates injection of electrons from the metal electrode (M) 23 into the organic layer (O) 22 is formed between the electrode 23 and the layer 22.

A luminescent operation of this luminescent device will be described below with reference to FIG. 8. FIG. 8 is a band diagram showing a state in which a negative voltage $-V$ is applied to the metal electrode 23 of the luminescent device. Electrons injected from the metal electrode 23 into the organic layer 22 upon application of the voltage are stored in a junction interface between the layer 22 and the semiconductor substrate 21, and holes in the substrate 21 are also stored in the junction interface between the layer 22 and the substrate 21, thereby forming an electric double layer in the junction interface. As in the first embodiment, these carriers are tunnel-injected into an adjacent layer through the blocking contact and recombined to emit light in at least one of the semiconductor substrate 21 and the organic layer 22. The emitted light is extracted through the substrate 21.

One characteristic feature of the luminescent device according to the present invention is that the device has a memory function in its luminescent characteristics. The memory function is obtained because the two types of carriers, i.e., electrons and holes are simultaneously injected into the organic layer. The reason for this will be described in more detail below.

Since an organic material used in a luminescent device generally has a small carrier mobility of at most $10^{-3}$ cm/V. sec, electrons injected in the material form a space charge. In this case, a current flowing in the material is an ohmic current (proportional to a voltage) in a low electric field and is a space-charge limitation current (proportional to the square of a voltage) which is limited by an internal electric field in a high electric field. Therefore, no memory function can be obtained. In the present invention, however, an electron injection property is imparted to one of the electrodes sandwiching the organic film, and a hole injection property is imparted to the other electrode. When a bias is applied, therefore, electrons and holes are simultaneously injected and stored in the organic film. In a state wherein carrier recombination occurs, a charge state of the organic film is neutralized, and the carrier mobility is increased 10 to 100 times accordingly. That is, the resistance of the organic film is decreased to allow a large current to flow. As a result, a hysteresis characteristic is produced in the electrical characteristics of the device upon constant-voltage driving, and a negative resistance characteristic is produced therein upon constant-current driving, thereby producing a memory function in the luminescent characteristics. In addition, this memory function appears as an afterimage phenomenon.

FIG. 9 shows a hysteresis characteristic of voltage V - current I obtained when the luminescent device of the present invention is constant-voltage-driven. Referring to FIG. 9, the current I on the ordinate corresponds to the luminosity of luminescence.

FIG. 10 is a negative resistance characteristic of voltage V - current I obtained when the luminescent device of the present invention is constant-current-driven. Referring to FIG. 10, the current I on the ordinate corresponds to the luminosity of luminescence.

In the luminescent device of the present invention, formation of the organic/inorganic semiconductor junction as described above can be confirmed by the following experiment. This experiment will be described below by taking the device of the embodiment shown in FIG. 1 as an example.

When DC electrical characteristics of the device are measured, a rectification characteristic as shown in FIG. 11 is obtained. A polarity which causes the metal electrode 13 to serve as a positive electrode corresponds to a forward direction. As described above, a forward current is flowed by tunnel injection obtained upon formation of the electric double layer. No current flows upon application of a reverse bias because no electrons are injected from the metal electrode 13 into the organic layer and the semiconductor substrate 11 is depleted.

A triangular-wave AC bias is applied to the luminescent device to measure a displacement current. A measurement region is a small current region near the origin of the voltage-current characteristic as indicated by a broken line in FIG. 11. FIG. 12 shows the obtained displacement current characteristic. In a reverse bias region, i.e., on the left side of a point A in FIG. 12, no carrier injection occurs in the organic film and a semiconductor near the junction portion is depleted as described above. In this case, since a portion between the two electrodes serves as a capacitor sandwiching the organic layer as an insulator and the depletion layer of a semiconductor, and a capacitance C is small. The displacement current I is generally represented by the following equation with respect to the capacitance C:

$$I = C \cdot dV/dt$$

In this case, the capacitance C is small because it is a series capacitance of the capacitance of the organic layer and that of the semiconductor depletion layer. Therefore, the displacement current is small.

When the bias approaches a zero bias from the reverse bias region, carrier injection from the electrode into the organic layer is started. In general, electron injection from the negative electrode and hole injection from the positive electrode do not simultaneously occur. In this case, if the electron injection from the negative electrode occurs earlier, the semiconductor depletion layer disappears. Since, however, the blocking barrier is formed with respect to the organic layer, the injected electrons are not injected into the organic layer but stored in the junction portion. Therefore, the capacitance becomes the value of only the organic layer, i.e., almost twice. This state corresponds to the point A shown in FIG. 12, and the displacement current is almost doubled. When the bias is increased and hole injection from the metal electrode 13 into the organic layer 12 is started, the electric double layer is formed in the organic film interface as described above, and the capacitance is increased to be the capacitance of the formed double layer, i.e., becomes very large. As shown in FIG. 12, therefore, the displacement current is largely increased at a point B at which the hole injection is started. As a result, since a large forward current flows by tunnel injection, luminescence is observed.

In this manner, the carrier injection and storage states of the device of this embodiment can be confirmed by measuring the displacement current characteristic of the device.

The operation mechanism of the luminescent device according to the present invention has been described above. In the present invention, formation of the electric double layer required to cause tunnel injection is based on the electrical characteristics of the organic/inorganic semiconductor junction surface. In a MIS luminescent device using conventionally known tunnel injection of an insulating film, a very thin insulating film free from pin holes, e.g., about 1 nm or less, must be formed. In the present invention, however, such an insulating film need not be used, and the thickness of the organic layer can be 10 to 100 nm or more. Therefore, a problem of pin holes which is a fatal defect of the MIS luminescent device can be avoided in the present invention.

In the above description, light is emitted in at least one of the organic layer and the semiconductor substrate. If, however, one of the organic layer and the semiconductor substrate serves as a main luminescent layer, optimization of the device is performed in the following manner.

(a) In the embodiment using an n-type semiconductor substrate (FIG. 1)

(1) A case wherein the organic layer serves as a main luminescent layer $$E_{CS} - E_{CO} < E_{VS} - E_{VO} \tag{9}$$

(2) A case wherein the semiconductor substrate serves as a main luminescent layer $$E_{CS} - E_{CO} > E_{VS} - E_{VO} \tag{10}$$

(b) In the embodiment using a p-type semiconductor substrate (FIG. 5)

(3) A case wherein the organic layer serves as a main luminescent layer $$E_{CO} - E_{CS} > E_{VO} - E_{VS} \tag{11}$$

(4) A case wherein the semiconductor layer serves as a main luminescent layer $$E_{CO} - E_{CS} < E_{VO} - E_{VS} \tag{12}$$

That is, if the luminescent device shown in FIG. 1 satisfies the relation (9), electron injection from the semiconductor substrate into the organic layer occurs in an electric field lower than that of hole injection from the organic layer into the semiconductor substrate, and luminescence in the organic layer becomes dominant. In addition, since the relation (9) indicates that the band gap of the semiconductor substrate is wider than that of the organic layer, the luminescence in the organic layer is not reabsorbed by the semiconductor substrate but externally extracted. If the relation (10) is satisfied, the hole injection into the semiconductor substrate is higher than the electron injection, and luminescence in the semiconductor substrate becomes dominant. The luminescence in the semiconductor substrate is not shielded by the organic layer but externally extracted.

This is the same as in a case wherein the relation (11) or (12) is satisfied in the luminescent device shown in FIG. 5 except that the type of carriers injected prior to the other is opposite.

When luminescence occurs in both the organic layer and the semiconductor substrate under the conditions represented by the relations (9) to (12), luminescence having mixed colors can be obtained, and a one-pixel multicolor display device can be realized. For example, under the condition of relation (9), long-wavelength luminescence is obtained in the organic layer upon application of a low voltage, and short-wavelength luminescence is additionally obtained in the semiconductor substrate upon application of a high voltage.

The organic/inorganic semiconductor junction type luminescent device according to the present invention has an advantage of a longer life than that of a device using only an organic layer. This long life is obtained because many inorganic semiconductors have high thermal conductivities and therefore destruction of an organic film caused by Joule heat generated by a current flowing through the device is prevented.

The present invention will be described in more detail below by way of its experimental examples.

EXPERIMENTAL EXAMPLE 1

In the luminescent device structure shown in FIG. 1,
semiconductor substrate 11: n-type GaP
organic layer 12: bicoronenyl (=luminescent layer)
metal electrode 13: Au
ohmic metal 14: AuGe
were used. A device formation process was as follows. That is, a 100-nm thick thin bicoronenyl film was formed by a vacuum sublimation method (vacuum degree $\sim 10^{-6}$ Torr) on an n-type GaP substrate having a donut-like AuGe electrode formed on its lower surface by vacuum deposition, and a 50-nm thick Au electrode was formed thereon by the vacuum deposition method.

When a bias was applied to the device by using the Au electrode as an anode, a current of 10 mA/cm$^2$ flowed at a voltage of 5 V, and yellowish orange luminescence having a luminosity of 1,000 Cd/m$^2$ was obtained.

EXPERIMENTAL EXAMPLE 2

In the luminescent device structure shown in FIG. 1,
semiconductor substrate 11: n-type GaP (=luminescent layer)
organic layer 12: triphenylamine derivative
metal electrode 13: Au
ohmic metal 14: AuGe
were used.

A device formation process was as the same as that of Experimental Example 1. When a bias was applied by using the Au electrode as an anode, a current of 50 mA/cm$^2$ flowed at an application voltage of 5 V, and green luminescence having a luminosity of 500 Cd/m$^2$ was obtained.

Several devices each using an inorganic semiconductor substrate as another luminophor in place of the n-type GaP Substrate were formed.

In a device using a substrate in which an n-type GaAs$_{0.6}$P$_{0.4}$ layer was epitaxially grown on an n-type GaP substrate, a current of 10 mA/cm$^2$ flowed at an application voltage of 5 V, and red luminescence having a luminosity of 1,000 Cd/m$^2$ was obtained.

In a device using a substrate in which an n-type Ga$_{0.65}$Al$_{0.35}$As layer was epitaxially grown on an n-type GaAs substrate having an Ni/AuGe electrode deposited on its lower surface and the lower surface was partially removed, red luminescence having a luminosity of 2,000 Cd/m$^2$ was obtained.

In a device using a ZnS substrate having an InGa electrode formed on its lower surface, a current of 50 mA/cm$^2$ flowed at a voltage of 5 V, and blue luminescence having a luminosity of 500 Cd/m$^2$ was obtained.

EXPERIMENTAL EXAMPLE 3

In the luminescent device structure shown in FIG. 1,
semiconductor substrate 11: n-type ZnS (=luminescent layer)
organic layer 12: bicoronenyl derivative (=luminescent layer
metal electrode 13: Au
ohmic metal 14: InGa
were used.

A device formation process was as follows. That is, a 100-nm thick bicoronenyl derivative film was formed by a vacuum sublimation method on an n-type ZnS substrate having a donut-like InGa electrode formed on its lower surface, and an Au electrode was formed thereon by a vacuum deposition method.

When a bias was applied by using the Au electrode as anode, a current of 10 mA/cm$^2$ flowed at a voltage of 5 V, and yellowish orange luminescence having a luminosity of 200 Cd/m$^2$ was obtained. This luminescence was obtained by the bicoronenyl derivative. When the application voltage was increased to 10 V, a current of 100 mA/cm$^2$ flowed, and white luminescence having a luminosity of 2,000 Cd/m$^2$ was obtained. This is because blue luminescence from the ZnS substrate was mixed in the luminescence from the organic film.

EXPERIMENTAL EXAMPLE 4

In the luminescent device structure shown in FIG. 1,
semiconductor substrate 11: n-type GaP
organic layer 12: bis(dibenzocarbazolyl)-N,N-dimethyltriphenylmethane (=luminescent layer)

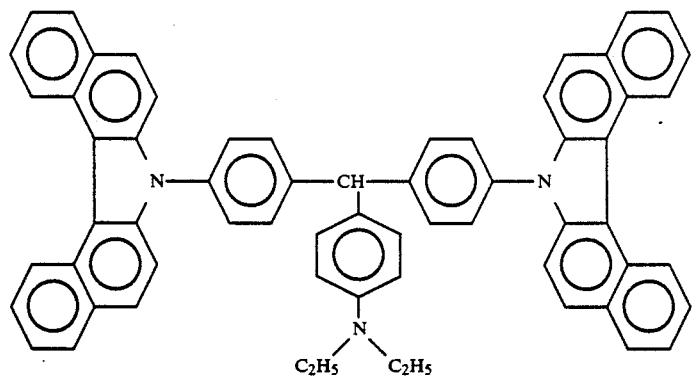

metal electrode 13: Au
ohmic metal 14: AuGe
were used.

A device formation process was the same as in Experimental Example 1. When a positive bias was applied to the Au electrode, green luminescence was obtained from the organic layer.

Figure 13:
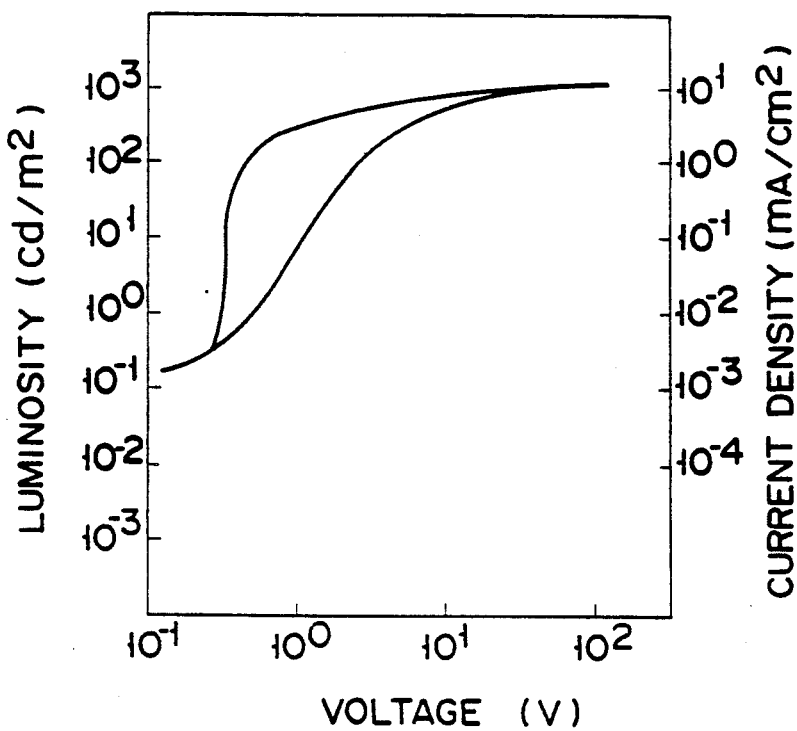
FIG. 13 is a graph showing hysteresis characteristics of a luminescent device according to a practical embodiment.
Figure 14:
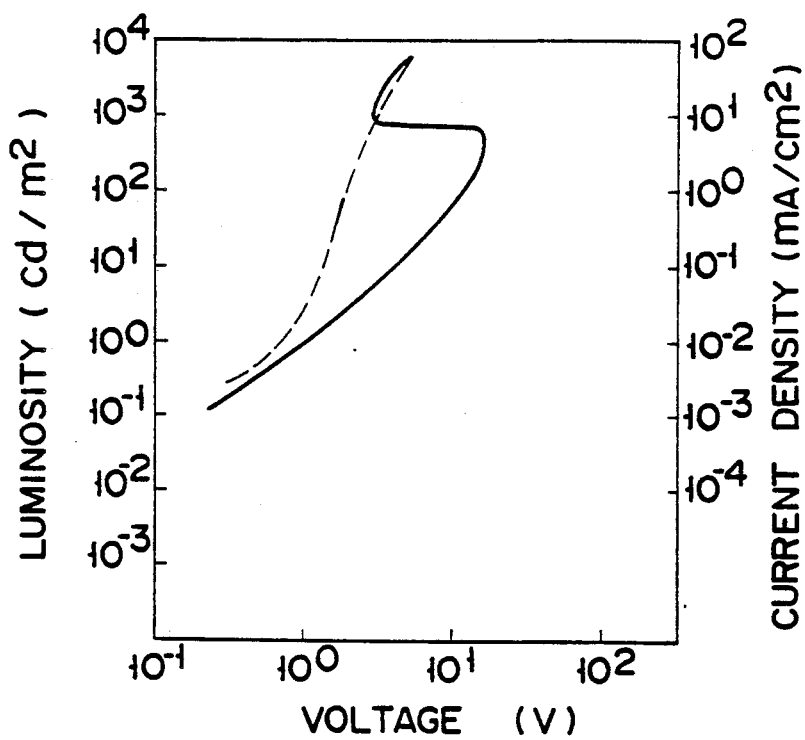
FIG. 14 is a graph showing negative resistance characteristics thereof.

FIG. 13 shows hysteresis characteristics obtained by constant-voltage-driving the luminescent device of the experimental example. FIG. 14 shows negative resistance characteristics obtained by constant-current-driving the device. FIG. 15 shows afterimage characteristics obtained by pulse-driving the device. As shown in FIGS. 13, 14, and 15, the luminescent device of this experimental example has a memory function in its luminescent characteristics.

An average luminous efficacy of the device was about 10%, and its life reached 100,000 hours.

EXPERIMENTAL EXAMPLE 5

In the luminescent device structure shown in FIG. 1,
n-type semiconductor substrate 11: n-type GaP (=luminescent layer)
organic layer 12: tris(diphenylamino)triphenylmethane

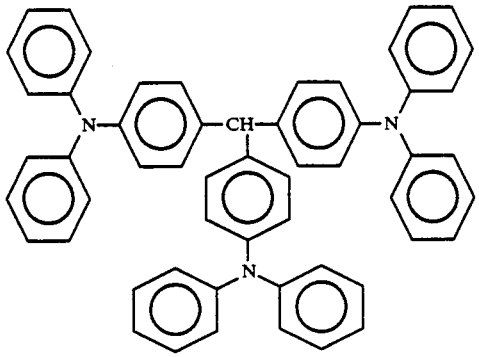

metal electrode 13: Au
ohmic metal 14: AuGe were used. A device formation process was the same as that in Experimental Example 1. When a bias was applied by using the Au electrode as an anode, a current of 50 mA/cm² flowed at an application voltage of 5 V, and green luminescence having a luminosity of 500 Cd/cm² was obtained.

Several devices each using an inorganic semiconductor substrate as another luminophor in place of the n-type GaP substrate were formed.

In a device using a substrate in which an n-type GaAs$_{0.6}$P$_{0.4}$ layer was epitaxially grown on an n-type GaP substrate, a current of 10 mA/cm² flowed at an application voltage of 5 V, and red luminescence having a luminosity of 1,000 Cd/cm² was obtained.

In a device using a substrate in which an n-type Ga$_{0.65}$Al$_{0.3}$As layer was epitaxially grown on an n-type GaAs substrate having an Ni/AuGe electrode deposited on its lower surface and the lower surface was partially removed, red luminescence having a luminosity of 2,000 Cd/m² was obtained.

In a device using a ZnS substrate having an InGa electrode on its lower surface, a current of 50 mA/m² flowed at a voltage of 5 V, and blue luminescence having a luminosity of 500 Cd/m² was obtained.

Although luminescence was obtained on the semiconductor side in the device of this experimental example, electrons were also tunnel-injected in the organic layer which was not luminescent, and memory characteristics as those obtained in Experimental Example 4 were obtained.

An average luminous efficacy of the device was about 10%, and its life reached 100,000 hours.

An embodiment in which the present invention is applied to a field-effect device (FET) will be described below. An FET having excellent characteristics can be obtained by applying an organic/inorganic semiconductor junction of a luminescent device and the principle of formation of an electric double layer utilizing injection of electrons and holes to a gate portion. In the case of an FET, not only a compound semiconductor but also Si and the like can be used. An organic layer has a large number of types and a wide range of positions of a conduction band, a Fermi level, and a valence band as a semiconductor as compared with an inorganic semiconductor. In order to realize a heterojunction, a lattice constant is strictly limited in an inorganic semiconductor. Since, however, a dye molecule has an electron structure of a closed shell type, it does not have a so-called dangling bond on its surface and therefore can be freely bonded with another material. For these reasons, by using an organic/inorganic semiconductor junction, a good heterojunction which cannot be obtained by using only an inorganic semiconductor can be easily realized.

Figure 16:
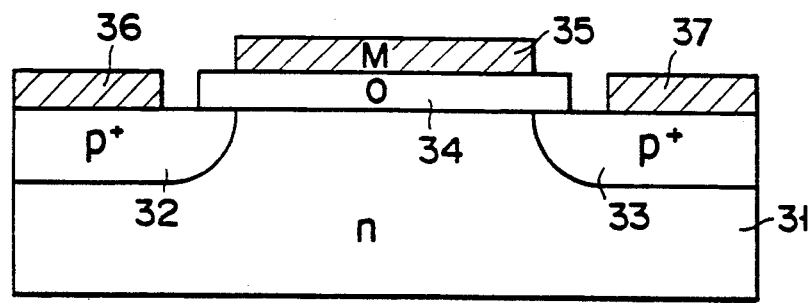
FIG. 16 is a sectional view showing an embodiment in which the present invention is applied to a p-channel FET.

FIG. 16 is an embodiment of a p-channel FET using an n-type inorganic semiconductor substrate. A p-type source layer 32 and a p-type drain layer 33 are formed to be separated from each other on an n-type semiconductor substrate (S) 31. Electrodes 36 and 37 are formed on the source and drain layers 32 and 33, respectively. A gate electrode 35 is formed between the source layer 32 and the drain layer 33 of the substrate 31 via an organic layer (O) 34.

Figure 17:
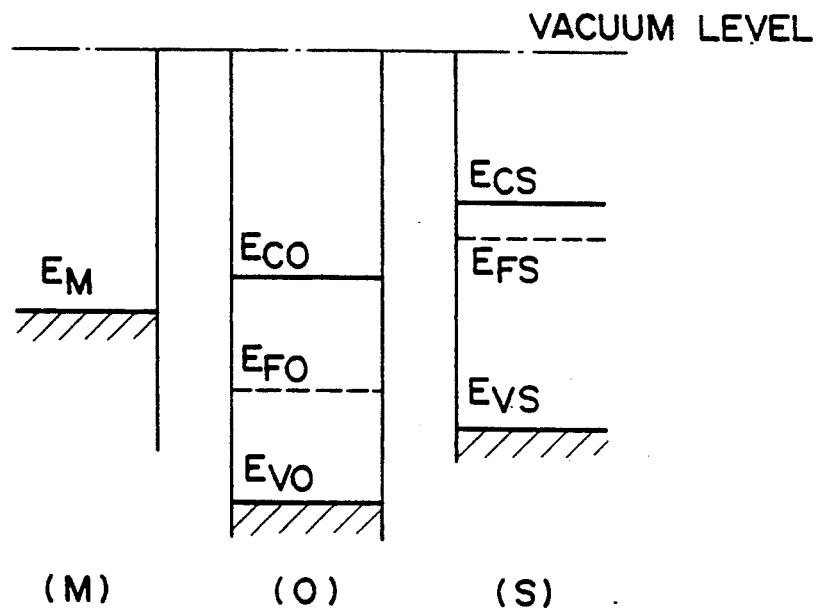
FIG. 17 is a band diagram showing electrical characteristics of each portion of the p-channel FET shown in FIG. 16 before bonding.

FIG. 17 shows electrical characteristics of gate electrode (M)-organic layer (O)-semiconductor substrate (S) of the FET of this embodiment obtained before bonding. That is, assuming that the conduction band level, the Fermi level, and the valence band level of the semiconductor substrate 31 are $E_{CS}$, $E_{FS}$, and $E_{VS}$, respectively, the conduction band level, the Fermi level, and the valence band level of the organic layer 34 are $E_{CO}$, $E_{FO}$, and $E_{VO}$, respectively, and the work function of the gate electrode 35 is $E_M$, materials are so selected as to satisfy the following relations:

$$E_{CO} > E_{CS} \tag{13}$$

$$E_{VO} > E_{VS} \tag{14}$$

$$E_M > E_{FO} \tag{15}$$

Figure 18:
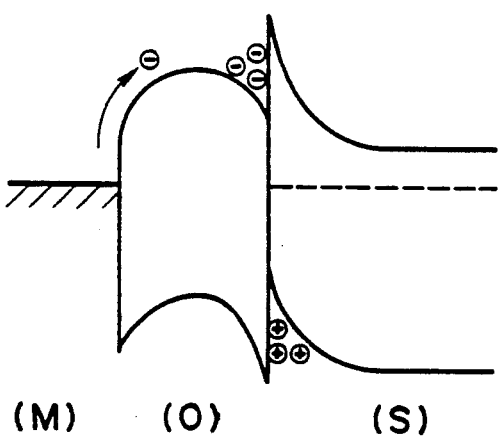
FIG. 18 is a band diagram showing a thermal equilibrium state thereof after bonding.

FIG. 18 is a band diagram showing a thermal equilibrium state of the gate portion of an FET which satisfies the above conditions. The organic layer 34 has an electron injection property. In a junction portion between the organic layer 34 and the semiconductor substrate 31, a blocking barrier is formed in the conduction band against electrons injected from the layer 34 into the substrate 31, and a blocking barrier is formed in the valence band against holes injected from the substrate 31 into the layer 34. Therefore, en electric double layer is formed in the junction portion between the organic layer 34 and the semiconductor substrate 31. As a result, a p-type inversion layer is formed on the surface of the substrate 31. Therefore, this device is of a depletion type FET.

When a negative bias is applied to the gate electrode 35, the density of the inversion layer is increased to increase a source-drain current. In a MOSFET using only a normal inorganic semiconductor, an electric field intensity applied on a channel depends on the thickness of a gate insulating film and is about 10⁵ V/cm in a normal operation. In the FET of this embodiment, however, since an external voltage is applied on a portion of the electric double layer having a thickness of essentially about 1 nm, an electric field intensity of about 10⁷ V/cm is easily obtained. That is, since a large drain current can be controlled by a small gate voltage, a high transconductance gm is obtained.

In addition, an enhancement type FET can be easily obtained by selecting a combination of the materials of the organic layer 34 and the gate electrode 35.

FIG. 19 shows an embodiment of an n-channel FET. Referring to FIG. 19, an n-type source layer 42 and an n-type drain layer 43 are formed to be separated from each other on a p-type semiconductor substrate. Source and drain electrodes 46 and 47 are respectively formed on source and drain layers 42 and 43, and a gate electrode 45 is formed on the surface of the substrate between the layers 42 and 43 via an organic layer 44.

FIG. 20 shows electrical characteristics of gate electrode (M)-organic layer (O)-semiconductor substrate (S) of the FE of this embodiment obtained before bonding. In this embodiment, unlike in the above n-channel FET, materials are so selected as to satisfy the following relations:

$$E_{CO} < E_{cS} \qquad (16)$$

$$E_{VO} < E_{VS} \qquad (17)$$

$$E_M > E_{FO} \qquad (18)$$

FIG. 21 is a band diagram showing a thermal equilibrium state of the gate portion of the FET of this embodiment. In this embodiment, the organic layer 44 has a hole injection property. In a junction portion between the organic layer 44 and the semiconductor substrate 41, a blocking barrier is formed in the conduction band against injection of electrons from the substrate 41 into the layer 44, and a blocking barrier is formed in the valence band against injection of holes from the layer 44 into the substrate 41. An electric double layer is formed in the junction portion between the organic layer 44 and the semiconductor substrate 41, and an n-type inversion layer is formed on the surface of the substrate 41. When a positive bias is applied on the gate electrode 45, a larger drain current can flow.

As in the case of the p-channel FET, either a depletion type or enhancement type FET can be obtained by selecting the materials of the gate electrode 45 and the organic layer 44.

When carriers are injected into an organic dye material, the material sometimes causes a structural change in order to shield an electrostatic force of the carriers, thereby fixedly trapping the carriers. A general change is dimerization of a dye. This structural change does not occur when no carriers are injected but occurs when injection is started. When an enhancement type FET is formed by using a material which causes this phenomenon, a state in which an inversion channel is formed between the drain and source, i.e., a memory function is realized by the electric field formed by the carriers trapped in the organic layer even if a gate voltage is removed.

This memory function will be described below with reference to FIGS. 22A to 22D by taking an enhancement type p-channel FET having the arrangement shown in FIG. 16 as an example. As shown in FIG. 22A, when gate bias VG=0, no electric double layer is formed, and a depletion layer is formed on the substrate side of an organic layer/semiconductor substrate junction portion. When gate bias VG=−V is applied, an electric double layer is formed in the organic layer/semiconductor substrate junction interface by injection of electrons from a gate electrode into an organic layer, as shown in FIG. 22B, and a p-type inversion layer is formed to turn on the device. If this state continues for a predetermined time period, the organic layer causes a structural change to fixedly trap the injected electrons, as shown in FIG. 22C. Even after the gate bias is removed, therefore, the electrons are kept trapped in the organic layer, as shown in FIG. 22D, to keep the ON state of the device. A certain period of time is required before the trapping caused by this structural change is canceled. Therefore, a memory characteristic is obtained.

In order to impart a memory function to the FET characteristics as described above, an aromatic imide dye may be used as the organic layer.

Although the gate electrode and the organic layer are directly bonded to each other in the FET of the above embodiment, an insulating film consisting of an organic polymeric material or an inorganic material such as $SiO_2$ may be formed between the gate electrode and the organic layer. This structure can be effectively used to form an enhancement type FET having a high threshold value.

Practical examples of the FET will be described below.

EXPERIMENTAL EXAMPLE 6

In the FET structure shown in FIG. 16,
n-type semiconductor substrate 31: n-type Si
organic layer 34:

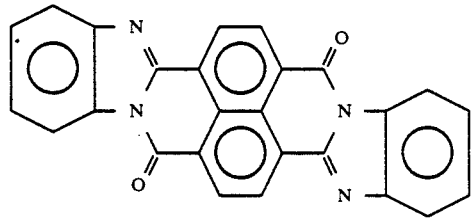

gate electrode 35: Au
were used.

A device formation process was as follows. P-type source and drain layers were formed by ion implantation into an n-type Si substrate, and source and drain electrodes were formed by depositing and patterning an Al film. Thereafter, a 50-nm thick organic layer was formed across the source and drain regions by a vacuum sublimation method (vacuum degree $\sim 10^{-6}$ Torr), and an Au gate electrode was formed thereon.

The obtained device was in an OFF state at a gate voltage of 0 V and was turned on upon application of a negative gate voltage. The device was kept in the ON state for a predetermined time period after the gate voltage was returned to 0 V.

EXPERIMENTAL EXAMPLE 7

In the FET structure shown in FIG. 19,
p-type semiconductor substrate 41: p-type Si
organic layer 44: tetra(paraisopropylphenyl)benzidine gate electrode 45: Au
were used. A manufacturing process was basically the same as that in Experimental Example 6.

It was confirmed that the obtained FET had a very high gm. That is, the FET of this example had a gm about 100 times that of a MOSFET having the same gate length and gate width and using a 50-nm thick $SiO_2$ film as a gate insulating film.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor luminescent device having a structure in which an organic layer is sandwiched between first and second electrodes and having an organic/inorganic junction in which at least said first electrode of said first and second electrodes consists of an n-type inorganic semiconductor,
    wherein a junction between said first electrode and said organic layer forms a blocking contact against electron injection from said first electrode into said organic layer and hole injection from said organic layer into said first electrode,
    a junction between said second electrode and said organic layer facilitates injection of holes from said second electrode into said organic layer, and
    an electric double layer is formed in the junction portion between said organic layer and said first electrode when a voltage positive with respect to said first electrode is applied to said second electrode, thereby causing tunnel injection of carriers between said first electrode and said organic layer to obtain recombination luminescence in at least one of said first electrode and said organic layer.

2. A device according to claim 1, wherein, assuming that energy differences of a lower end of a conduction band, a Fermi level, and an upper end of a valence band of said first electrode from a vacuum level are $E_{CS}$, $E_{FS}$, and $E_{VS}$, respectively, energy differences of a lower end of a conduction band, a Fermi level, and an upper end of a valence band of said organic layer from the vacuum level are $E_{CO}$, $E_{FO}$, and $E_{VO}$, respectively, and a work function of said second electrode is $E_M$, materials are so selected as to satisfy the following relations:

$$E_M > E_{FO}$$

$$E_{CO} < E_{CS}$$

$$E_{FO} < E_{FS}$$

$$E_{VO} < E_{VS}$$

3. A device according to claim 2, wherein said organic layer is a main luminescent layer, and the materials are so selected as to satisfy the following relation:

$$E_{CS} - E_{CO} < E_{VS} - E_{VO}$$

4. A device according to claim 2, wherein said first electrode is a main luminescent layer, and the materials are so selected as to satisfy the following relation:

$$E_{CS} - E_{CO} > E_{VS} - E_{VO}$$

5. A device according to claim 1, wherein an ohmic metal having a light exit window is formed on a surface of said first electrode.

6. A device according to claim 1, wherein said device exhibits hysteresis characteristics in voltage-current characteristics upon constant-voltage driving.

7. A device according to claim 1, wherein said device exhibits negative resistance characteristics in voltage-current characteristics upon constant-current driving.

8. A semiconductor luminescent device having a structure in which an organic layer is sandwiched between first and second electrodes and having an organic/inorganic junction in which at least said first electrode of said first and second electrodes consist of a p-type inorganic semiconductor,
    wherein a junction between said first electrode and said organic layer forms a blocking contact against hole injection from said first electrode into said organic layer and electron injection from said organic layer into said first electrode,
    a junction between said second electrode and said organic layer facilitates injection of electrons from said second electrode into said organic layer, and
    an electric double layer is formed in the junction portion between said organic layer and said first electrode when a voltage negative with respect to said first electrode is applied to said second electrode, thereby causing tunnel injection of carriers between said first electrode and said organic layer to obtain recombination luminescence in at least one of said first electrode and said organic layer.

9. A device according to claim 8, wherein, assuming that energy differences of a lower end of a conduction band, a Fermi level, and an upper end of a valence band of said first electrode from a vacuum level are $E_{CS}$, $E_{FS}$, and $E_{VS}$, respectively, energy differences of a lower end of a conduction band, a Fermi level, and an upper end of a valence band of said organic layer from the vacuum level are $E_{CO}$, $E_{FO}$, and $E_{VO}$, respectively, and a work function of said second electrode is $E_M$, materials are so selected as to satisfy the following relations:

$$E_M > E_{FO}$$

$$E_{CO} < E_{CS}$$

$$E_{FO} < E_{FS}$$

$$E_{VO} < E_{VS}$$

10. A device according to claim 9, wherein said organic layer is a main luminescent layer, and the materials are so selected as to satisfy the following $$E_{CO} - E_{CS} > E_{VO} - E_{VS}$$

11. A device according to claim 9, wherein said first electrode is a main luminescent layer, and the materials are so selected as to satisfy the following relation:

$$E_{CO} - E_{CS} < E_{VO} - E_{VS}$$

12. A device according to claim 8, wherein an ohmic metal having a light exit window is formed on a surface of said first electrode.

13. A device according to claim 8, wherein said device exhibits hysteresis characteristics in voltage-current characteristics upon constant-voltage driving.

14. A device according to claim 8, wherein said device exhibits negative resistance characteristics in voltage-current characteristics upon constant-current driving.

* * * * *